United States Patent
Valdes Garcia et al.

(10) Patent No.: US 10,608,335 B2
(45) Date of Patent: Mar. 31, 2020

(54) RF SIGNAL SWITCHING, PHASE SHIFTING AND POLARIZATION CONTROL

(71) Applicant: International Business Machines Corporation, Armonk, NY (US)

(72) Inventors: Alberto Valdes Garcia, Chappaqua, NY (US); Wayne H. Woods, Jr., Burlington, MA (US); Bodhisatwa Sadhu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 15/820,476

(22) Filed: Nov. 22, 2017

(65) Prior Publication Data

US 2019/0157754 A1    May 23, 2019

(51) Int. Cl.
*H01Q 3/24* (2006.01)
*H01Q 3/34* (2006.01)
(Continued)

(52) U.S. Cl.
CPC .............. *H01Q 3/24* (2013.01); *H01P 1/184* (2013.01); *H01P 5/04* (2013.01); *H01Q 3/34* (2013.01);
(Continued)

(58) Field of Classification Search
CPC .......... H03H 11/245; H03H 7/18; H03H 7/40; H03H 3/02; H03H 7/0115; H03H 9/605; H03H 7/48; H03H 7/1758; H03H 7/1775; H03H 7/463; H03H 7/1791; H04B 1/44; H04B 1/006; H04B 1/48; H04B 1/00; H04B 1/18; H04B 1/0458; H04B 1/525; H04B 1/0057; H01P 1/227; H01P 1/184; H01P 1/10; H01P 1/127; H01P 1/18; H01P 1/15;
(Continued)

(56) References Cited

U.S. PATENT DOCUMENTS 6,816,031 B1 *  11/2004  Miller ................. H01P 9/00
                                                      333/140
7,321,339 B2    1/2008  Mohamadi
(Continued)

FOREIGN PATENT DOCUMENTS

EP    1635418 A1    3/2006

OTHER PUBLICATIONS

Valdes Garcia et al., "RF Signal Switching, Phase Shifting and Polarization Control", U.S. Appl. No. 15/820,480, filed Nov. 22, 2017, 32 pages.
(Continued)

*Primary Examiner* — Olumide Ajibade Akonai
(74) *Attorney, Agent, or Firm* — Michael A. Petrocelli

(57) ABSTRACT

An apparatus includes first and second electronically tunable transmission lines configured to receive a signal pair and provide a selected phase delay difference to the signal pair, a first shunting element connected to the first electronically tunable transmission line and a second shunting element connected to the second electronically tunable transmission line. The first and second shunting elements may each be configured to selectively shunt the electronically tunable transmission line to which they are connected according to one or more shunting control signals. A corresponding method is also disclosed herein.

20 Claims, 7 Drawing Sheets

(51) Int. Cl.
*H01P 1/18* (2006.01)
*H01Q 3/36* (2006.01)
*H01P 5/04* (2006.01)
*H01Q 21/24* (2006.01)
*H04B 1/00* (2006.01)
*H04B 1/48* (2006.01)
*H01Q 25/00* (2006.01)
*H04B 1/44* (2006.01)
*H03H 11/24* (2006.01)
*H03H 7/18* (2006.01)

(52) U.S. Cl.
CPC ............ *H01Q 3/36* (2013.01); *H01Q 21/245* (2013.01); *H04B 1/00* (2013.01); *H01Q 25/001* (2013.01); *H03H 7/18* (2013.01); *H03H 11/245* (2013.01); *H04B 1/44* (2013.01); *H04B 1/48* (2013.01)

(58) Field of Classification Search
CPC .... H01P 9/00; H01P 5/04; H01Q 3/24; H01Q 21/245; H01Q 3/34; H01Q 3/36; H01Q 5/371; H01Q 1/243; H04L 25/0264; H04L 25/0298; H01L 2224/49175; H01L 23/64
See application file for complete search history.

(56) References Cited

U.S. PATENT DOCUMENTS

| | | | |
|---|---|---|---|
| 7,478,029 B1 | 1/2009 | Joffe | |
| 7,561,007 B1 | 7/2009 | Heissler | |
| 7,956,704 B1 | 6/2011 | Acimovic | |
| 8,994,399 B2* | 3/2015 | Ali | H03H 11/30 326/21 |
| 9,024,702 B2 | 5/2015 | Shin | |
| 9,106,502 B2 | 8/2015 | Teplitsky et al. | |
| 9,294,178 B2 | 3/2016 | Jung et al. | |
| 9,496,902 B2 | 11/2016 | Srirattana et al. | |
| 10,020,798 B2* | 7/2018 | Sharma | H03H 7/24 |
| 2003/0132814 A1* | 7/2003 | Nyberg | H01P 1/227 333/81 R |
| 2003/0137284 A1* | 7/2003 | DiPiazza | H03H 7/20 323/212 |
| 2005/0225385 A1* | 10/2005 | Merrill | H03F 1/526 330/124 D |
| 2009/0298443 A1* | 12/2009 | Ta | H01P 1/15 455/83 |
| 2014/0120968 A1* | 5/2014 | Mahmood | H01P 1/15 455/501 |
| 2014/0312986 A1 | 10/2014 | Edelstein et al. | |
| 2015/0054594 A1* | 2/2015 | Apriyana | H01P 1/15 333/103 |
| 2015/0094116 A1* | 4/2015 | Jeong | H03K 17/063 455/552.1 |
| 2015/0102869 A1* | 4/2015 | Wang | H01P 1/387 333/1.1 |
| 2016/0260584 A1* | 9/2016 | Marakhtanov | H01J 37/32183 |

OTHER PUBLICATIONS

IBM Appendix P, list of patents and patent applications treated as related, filed herewith, 2 pages.

Mendez-Rial et al., "Channel Estimation and Hybrid Combining for mmWave: Phase Shifters or Switches?", printed on Apr. 19, 2017, 8 pages.

Tousi et al., "A Ka-band Digitally-Controlled Phase Shifter with sub-degree Phase Precision", 2016 IEEE Radio Frequency Integrated Circuits Symposium, © 2016 IEEE, 4 pages.

Woods et al., "CMOS Millimeter Wave Phase Shifter Based on Tunable Transmission Lines", IBM Semiconductor Research and Development, Essex Junction, VT, © 2013 IEEE, 4 pages.

* cited by examiner

| 120C | 120D | 120A | 120B | AB Delay Diff. | T-line 110B path A | T-line 110B path B | Polarization |
|---|---|---|---|---|---|---|---|
| ON | ON | ON | ON | N/A | 90º | 90º | No signal |
| OFF | ON | OFF | ON | N/A | N/A | 90º | Horizontal |
| ON | OFF | ON | OFF | N/A | 90º | N/A | Vertical |
| OFF | OFF | OFF | OFF | 0º | N/A | N/A | Linear @ +45º |
| OFF | OFF | OFF | OFF | 180º | N/A | N/A | Linear @ -45º |
| OFF | OFF | OFF | OFF | 90º | N/A | N/A | Circular |
| OFF | OFF | OFF | OFF | ≠90º | N/A | N/A | Elliptical |

RF SIGNAL SWITCHING, PHASE SHIFTING AND POLARIZATION CONTROL

STATEMENT REGARDING FEDERALLY SPONSORED RESEARCH OR DEVELOPMENT

This invention was made with U.S. Government support under contract number FA8650-09-C-7924 awarded by the Department of Defense. The U.S. Government has certain rights to this invention.

BACKGROUND OF THE INVENTION

The present invention relates generally to electronic circuits such as integrated circuits, and more particularly to integrated RF circuits.

Signal switching, phase shifting, and polarization control are commonly needed in RF circuits. For example, phased array antenna systems may select which antennas are active and the phase delay associated with each active antenna and the type of polarization used in signal transmission and reception. While a number of techniques to achieve signal switching, phase shifting and polarization control in optical systems exist, these techniques are not amenable at RF and mmWave frequencies. At mmWave frequencies, electronically controlled signal switching, phase shifting, and polarization control has typically required separate function-specific circuits and components including phase shifters, switches, and variable gain control/variable attenuators that operate in the analog domain. However, the large number of circuit components used to achieve signal switching, phase shifting and polarization control consume a large chip area and degrade signal quality. Moreover, despite the large area and signal degradation introduced by such systems, these systems provide only coarse polarization control, by selecting from a few fixed polarization modes. Mechanical control of polarization is also possible but tends to be extremely slow and cumbersome.

SUMMARY

An apparatus includes first and second electronically tunable transmission lines configured to transmit or receive a signal pair and provide a selected phase delay difference to the signal pair, a first shunting element connected to the first electronically tunable transmission line and a second shunting element connected to the second electronically tunable transmission line. The first and second shunting elements may each be configured to selectively shunt the electronically tunable transmission line to which they are connected according to one or more shunting control signals. A corresponding method is also disclosed herein.

BRIEF DESCRIPTION OF THE DRAWINGS

FIGS. 2B, 2C, and 2D are two-dimensional projections of the E vector loci depicting various types of polarization control attainable through the polarization control module of FIG. 2A or the like;

DETAILED DESCRIPTION

At least some of the embodiments disclosed herein recognize that many RF circuits such as antenna array controllers require switching, selectable phase shifting and polarization control functions.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. These features and advantages will become more fully apparent from the following drawings, description and appended claims, or may be learned by the practice of the invention as set forth hereinafter.

As used herein, the phrase "shunting element" refers to an element that is changeable from a high impedance 'OFF' state where little or no current flows through the device to a low impedance 'ON' state where relatively high current flow is supported. Furthermore, the phrase "attenuation element" refers to an element that provides multiple selectable (discreet or continuous) levels of impedance and/or current flow.

Figure 1A:
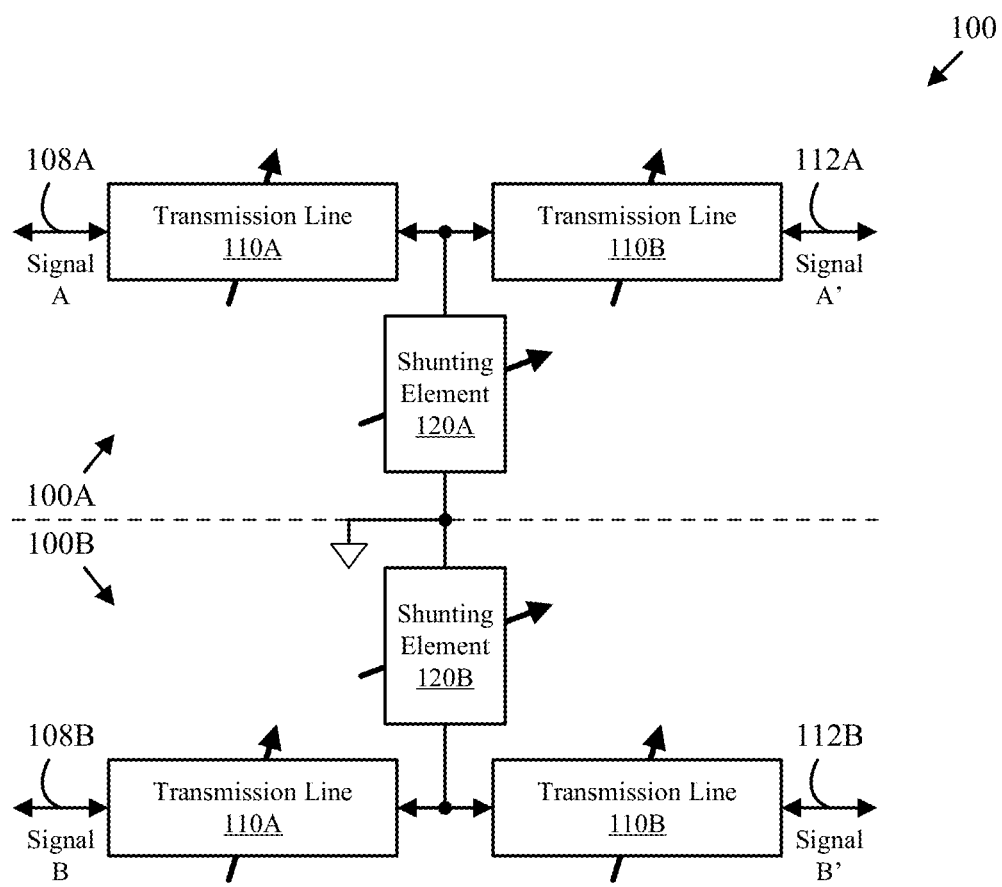
FIG. 1A is a schematic block diagram depicting one example of a switching module in accordance with at least one embodiment of the present invention.

FIG. 1A is a schematic block diagram depicting one example of a switching module 100 in accordance with at least one embodiment of the present invention. As depicted, the switching module 100 includes an upper switch 100A and a lower switch 100B. The upper switch 100A and the lower switch 100B each comprise a tunable transmission line 110 with one or more shunting elements 120 connected thereto. The switching module 100 enables switching, phase shifting, and polarization control to signals A and B provided to nodes 108 and presents those modified signals A' and B' to nodes 112. Alternately, switching, phase shifting, and polarization control may be applied to signals provided to nodes 112 to provide a pair of signals with a selected polarization and phase delay to nodes 108.

In the depicted example, nodes 108 include a first node 108A and a second node 108B that may carry signals whose electric fields have a phase and amplitude relationship that corresponds with a particular polarization (e.g., when propagating in space) The signals carried by the nodes 108 may be orthogonal to each other (i.e., have a 90 degree difference between the E-planes). For example, in one receive mode, the first node 108A and the second node 108B may carry H and V signals respectively provided by a horizontally polarized antenna (not shown) and a vertically polarized antenna (not shown).

In the depicted example, each of the tunable transmission lines 110 are electronically tunable transmission lines that are partitioned into a first segment 110A and a second segment 110B. The first segment 110A and the second segment 110B are preferably tunable but may, or may not, be of differing lengths (i.e., have differing maximum delays). By tuning the transmission lines 110, the delay on the signals propagated thereon may be adjusted resulting in a selectable phase shift to signals propagated thereon.

In the depicted example, each transmission line 110 comprises two segments and a single shunting element 120 is connected to each transmission line 110. Namely, a upper shunting element 120A is connected to the transmission line 110 of the upper switch 100A (i.e., the A signal path) and a lower shunting element 120B is connected to the transmission line 110 of the lower switch 100B (i.e., the B signal path). However, each transmission line 110 may have many segments and multiple shunting elements connected thereto.

One of skill in the art will appreciate that the tunable transmission lines 110 may be passive and/or bi-directional transmission lines that can propagate a signal in either direction. Consequently, the nodes 108 and 112 may function as inputs and/or outputs and switching module 100 may be used in full-duplex as well as half-duplex applications.

Figure 1B:
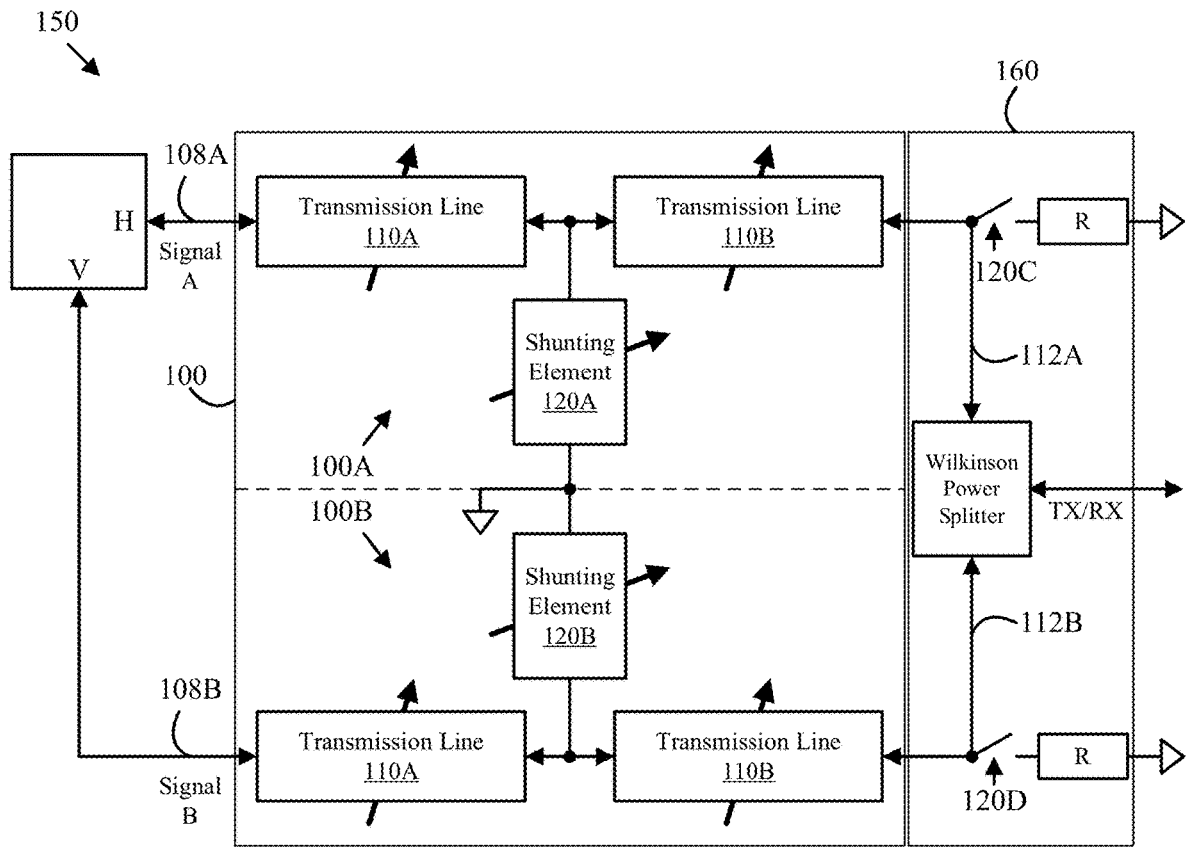
FIG. 1B is a schematic block diagram and associated table depicting one application of the switching module of FIG. 1A in accordance with at least one embodiment of the present invention.

FIG. 1B is a functional block diagram and associated table depicting one example of a front end module 150 for an RF transceiver attainable through one particular version of the switching module 100 depicted in FIG. 1A. The depicted front end module 150 utilizes a switching module 100 where each shunting element 120 comprises a transistor driven to either an 'ON' (low resistance) state or an 'OFF' (high resistance) state, an HV antenna is connected to nodes 108, and a composite signal is applied to and/or received at nodes 112 (i.e., 112A and 112B). An optional 3-port interface block (160) can provide signal split/combine functions, isolation between notes 112A and 112B, and impedance matching at nodes 112A, 112B and 112. As shown, an example implementation comprises a Wilkinson power divider, switches 120C, 120D and resistors R. Other active or passive implementations could be derived by someone skilled in the art.

By shunting either the A (i.e., H) signal path or the B (i.e., V) signal path, and setting the transmission line delay to be equal to a quarter-wave electrical length, the short at the shunted node can be translated to an open at nodes 108 and 112. As a result, any applied signal encounters a high impedance towards the shunted path, and does not flow into the shunted path. Consequently, by shunting just one of the signal paths 110, the switching module 100 behaves as a switch. By shunting both signal paths, nodes 112A and 112B are isolated from nodes 108A and 108B, respectively.

As shown in FIG. 1B, polarization and phase delay control may also be achieved by the described switching module 100. This may be accomplished by not shunting either transmission line 110 and controlling (tuning) the delay difference provided to the A signal path and the B signal path by the upper transmission line 110 and the lower transmission line 110, respectively. For example, by providing a 90 degree phase difference between the upper transmission line 110 and the lower transmission line 110, circular polarization may be supported by front end module 150.

Figure 1C:
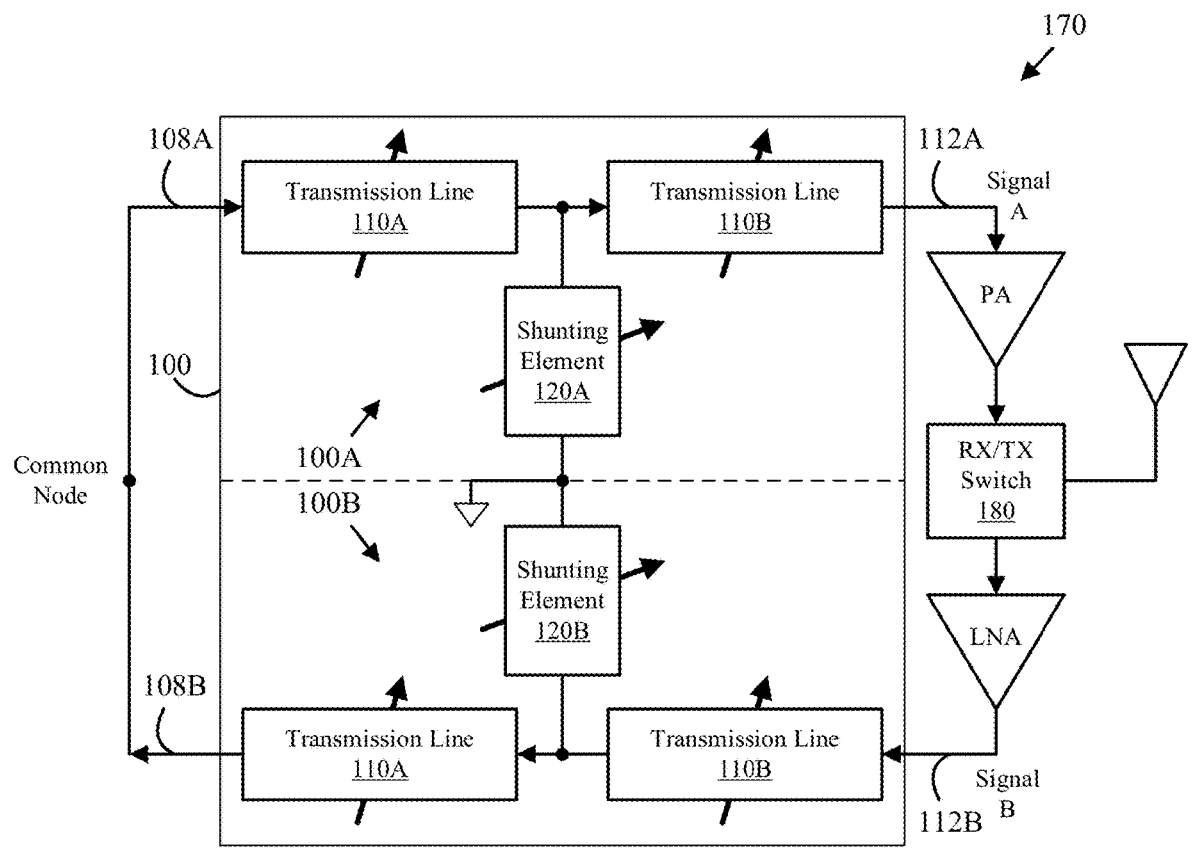
FIG. 1C is a schematic block diagram and associated table depicting another application of the switching module of FIG. 1A in accordance with at least one embodiment of the present invention.

FIG. 1C is a functional block diagram and associated table depicting one example of a front end module 110 for an RF transceiver attainable through one particular version of the switching module 100 depicted in FIG. 1A. Similar to the front end module 150, the depicted front end module 170 utilizes a switching module 100 where each shunting element 120 comprises a transistor driven to either an 'ON' (low resistance) state or an 'OFF' (high resistance) state. In the depicted embodiment, nodes 108 are tied to a common node that may source and/or sink a signal. Node 112A provides transmit connectivity to an antenna via a power amplifier (PA) and a RX/TX switch 180. Similarly, node 112B provides receive connectivity to the antenna, via the RX/TX switch 180 and a low noise amplifier (LNA).

By shunting either the A (i.e., TX) signal path or the B (i.e., RX) signal path, and setting the corresponding transmission line delay to be equal to a quarter-wave electrical length, the short at the shunted node can be translated to an open at nodes 108A and 112B, respectively. As shown in the associated table of FIG. 1C, by shunting the TX signal path or the RX signal path the front end transceiver 170 operates in a receive mode or a transmit mode respectively. By shunting both signal paths, the front end transceiver 170 is put into an isolation mode.

Figure 2A:
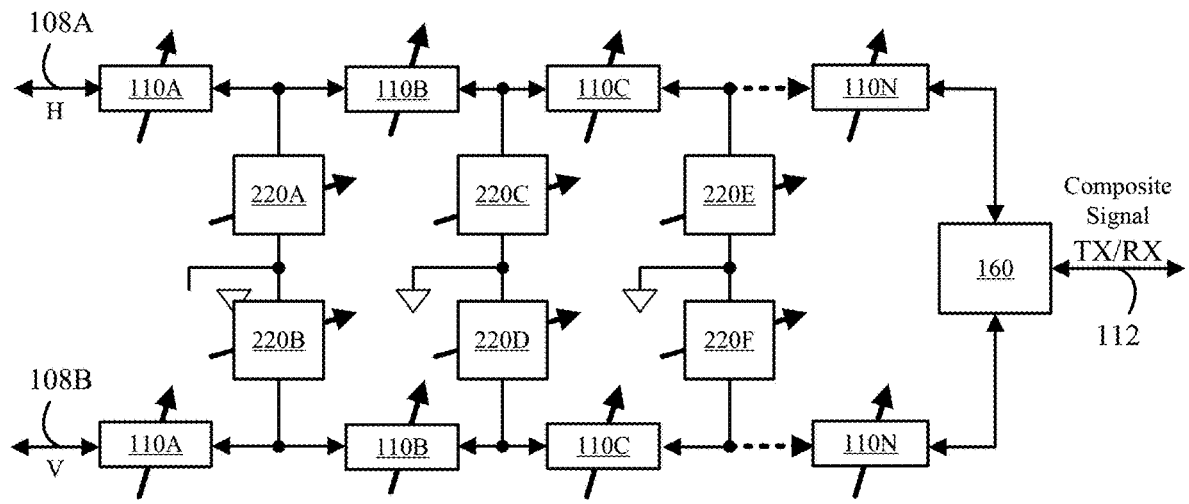
FIG. 2A is a schematic block diagram depicting one example of a polarization control module in accordance with at least one embodiment of the present invention.

FIG. 2A is a schematic block diagram depicting one example of a polarization control module 200 in accordance with at least one embodiment of the present invention. As depicted, the polarization control module 200 includes two tunable transmission lines 110 with multiple attenuation elements 220 connected thereto. In the depicted example, each of the tunable transmission lines 110 are partitioned into four segments labeled 110A, 110B, 110C and 110N with three attenuation elements 220A, 220B, and 220C connected thereto. However, an arbitrary number of segments and attenuation elements may be used.

Similar to the switching module 100, the polarization control module 200 enables switching and polarization control to the signals provided by one or more inputs 108 and presents those signals as a composite signal to a common node 112 via a power splitter/divider 160 such as a Wilkinson splitter/divider. The depicted polarization control module 200 may provide greater attenuation and polarization control than the depicted switching module 100 due to the inclusion of multiple attenuation elements 220. The attenuation elements 220 may also have a large number of attainable attenuation settings/steps that enable greater attenuation and polarization control.

Figure 2B:
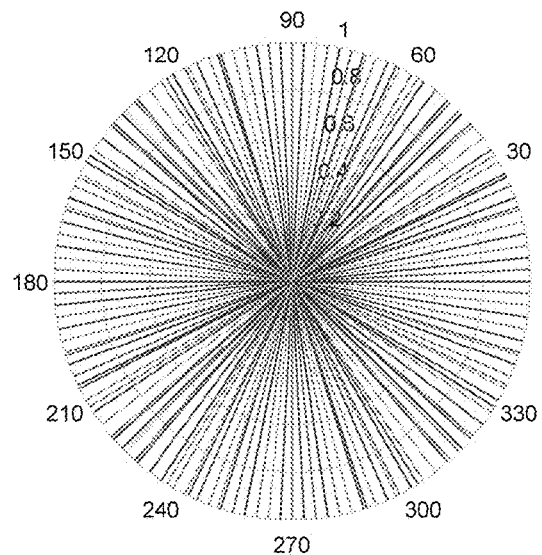
Figure 2C:
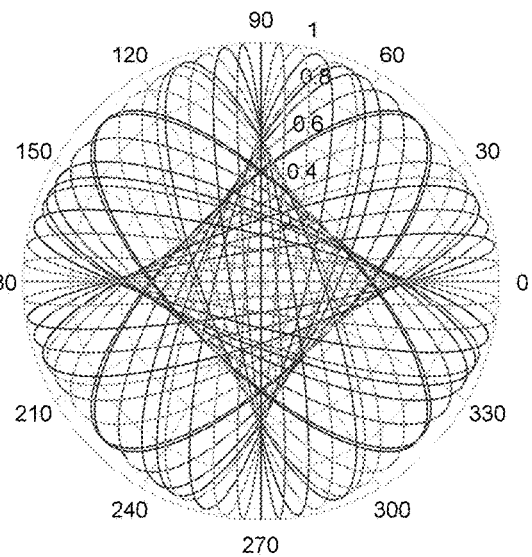
Figure 2D:
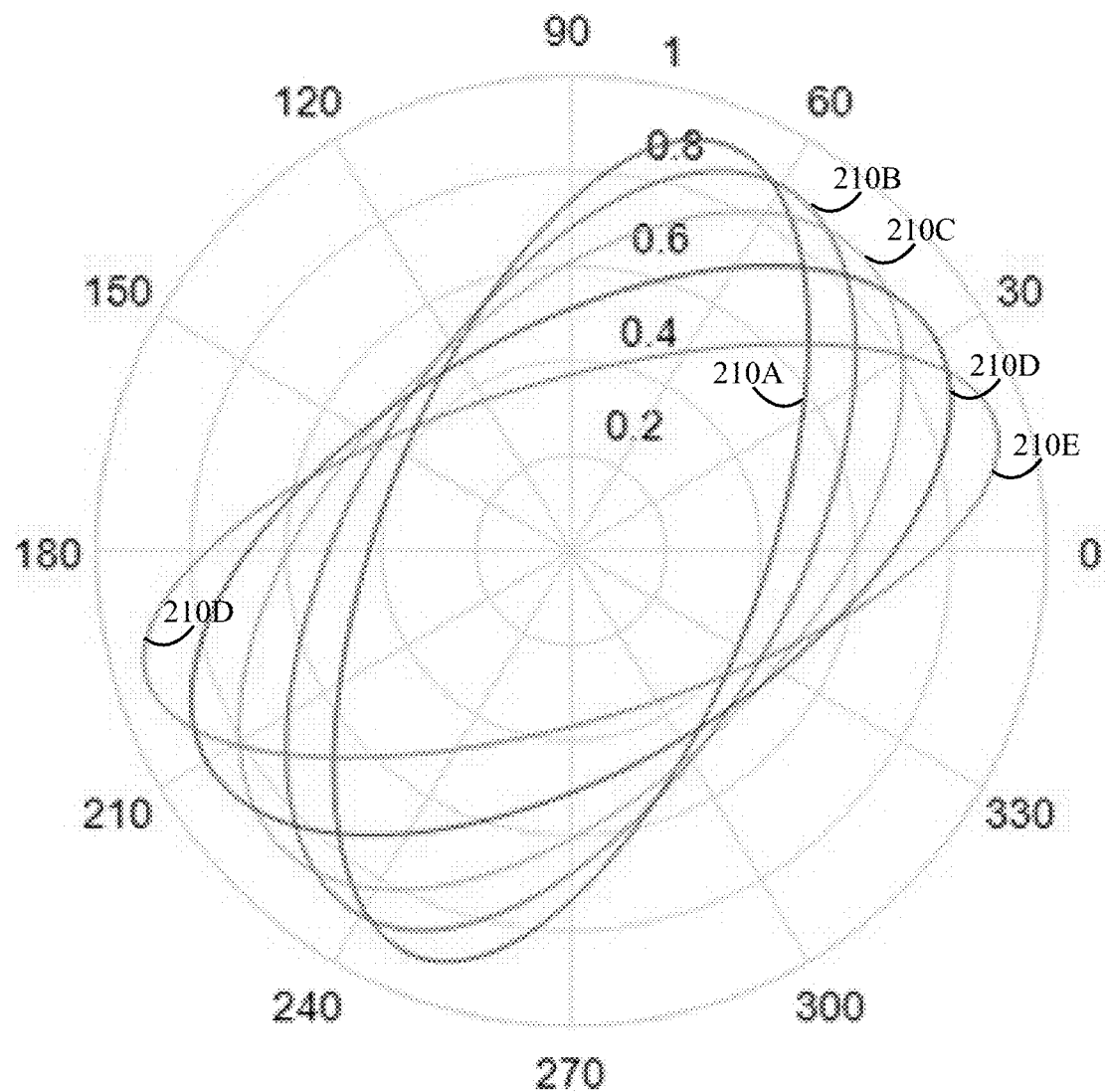

FIGS. 2B, 2C and 2D are polar plots depicting various types of polarization control attainable through the polarization control module of FIG. 2A. FIG. 2B depicts a scenario where the delay applied to the signals provided to nodes 108A and 108B is equal. By applying various attenuation settings to one path compared to the other, a large number of linear polarizations may be achieved. FIG. 2C depicts a scenario where the delay applied to the inputs 108A and 108B is offset by 15 degrees. For FIG. 2C, the attenuation controls are used to create a differential attenuation between the two paths with 10 attenuation steps per path. FIG. 2D depicts a scenario where the delay applied to the inputs 108A and 108B is offset by 45 degrees. By controlling the relative amplitudes of the H and V paths, a polarization response 210 can be varied. The depicted polarization responses 210A, 210B, 210C, 210D, and 210E correspond to H amplitudes of 0.5, 0.6, 0.7, 0.8, and 0.9 respectively, and V amplitudes equal to the square root of (1-Hamp^2). The appropriate H amplitudes and V amplitudes may be selected via the attenuation elements 220.

One of skill in the art will appreciate that the means and methods disclosed herein enable switching, phase shifting, and polarization control of RF and mmWave signals. In some embodiments, a single variable delay transmission line with integrated shunting or attenuation elements is used in each signal path. Using a variable delay transmission line enables signal switching by transforming a short provided by a shunting or attenuation element to an open—by tuning the variable delay transmission line to a quarter-wave length (or an odd multiple thereof). Furthermore, phase shifting may be accomplished by changing the delay of the variable delay line and amplitude control can be achieved via the integrated shunting or attenuation elements. Consequently, signal switching and arbitrary amplitude and polarization control can be achieved with less area, less cost, and greater fidelity than previous solutions. One of skill in the art will also appreciate that many variations of the disclosed embodiments, as well as other embodiments, may be implemented that fit within the scope of the claimed invention.

Figure 3:
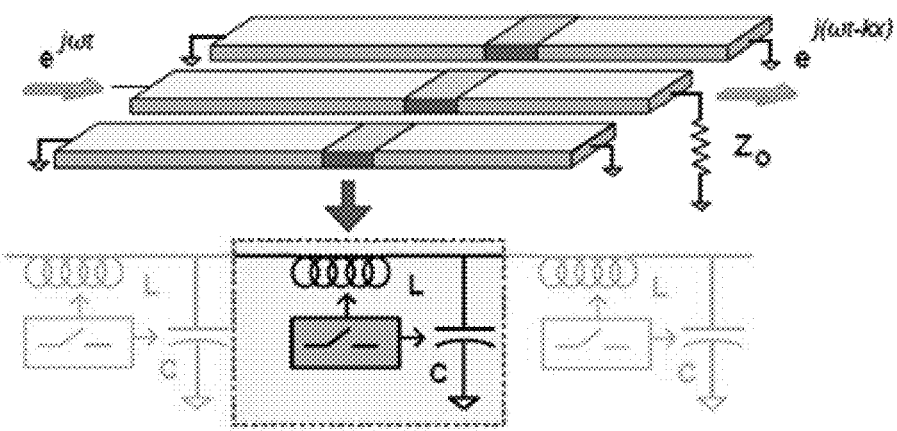
FIG. 3 is schematic diagram of one example of a tunable phase shifter in accordance with at least one embodiment of the present invention.
Figure 4:
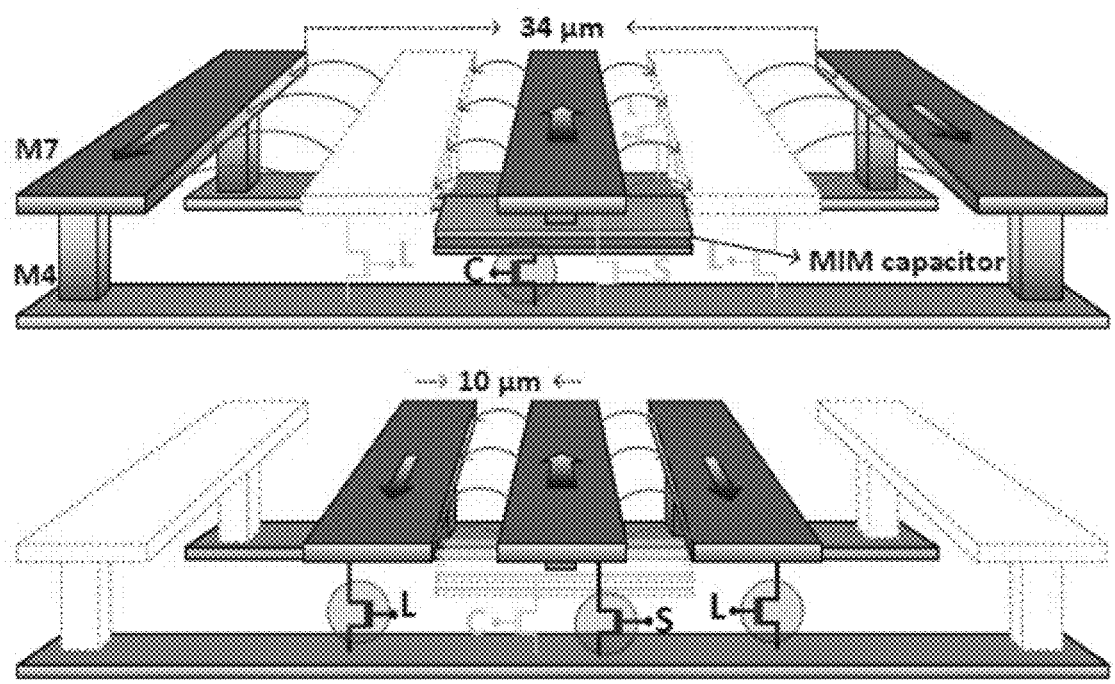
FIG. 4 is hybrid layout and schematic diagram of one example of a tunable phase shifter in accordance with at least one embodiment of the present invention.

FIGS. 3 and 4 depict one example of a tunable phase shifter that is suitable for use as the tunable transmission line 110. While FIGS. 3 and 4 depict one such example, other embodiments may be known to those of skill in the art.

The delay of a transmission line is the product of the physical length and the wavenumber. For an integrated tunable transmission line with a fixed length, we can change the phase shift by tuning the wavenumber of the transmission line. As shown in FIG. 3, a slow-wave artificial transmission line may be constructed that enables controlling the propagation velocity of the signal by changing the values of the equivalent inductors and capacitors in each section. Such an artificial transmission line is a good approximation to the dispersion-free transmission line transfer function as long as the resulting delay from each unit cell is small compared to the period of the highest frequency of interest. Consequently, the smaller the inductor and capacitors are in the unit section, the more nearly the artificial transmission line approximates an ideal wide-band delay line.

A common limiting factor in the accuracy of the depicted switch-based phase shifter is the change in the characteristic impedance that results from switching between different modes of operation. When a large phase shift per section is used, the phase properties are essentially those of a lumped circuit. As a result, dispersion effects limit the phase linearity and overall phase and amplitude accuracy.

By ensuring a small phase shift per unit, the phase shifter behaves closer to a true transmission line with a distributed structure. By ensuring that the switching between two delay modes in each cell maintains a selected fixed ratio between the effective inductance and capacitance of the cell, a nearly constant characteristic impedance may be achieved. This results in a structure with minimal inter-block reflections and a maximally linear phase tuning.

FIG. 4 shows that each unit cell of the phase shifter includes a coplanar waveguide and a shunt capacitor to ground. The coplanar waveguide is comprised of two sets of parallel groundlines, one set is close to the signal line while the other set is farther apart. The outer parallel lines are directly connected to ground, while the inner lines are grounded through a pair of NMOS switches, controlled by the bit 'L'. The purpose of these NMOS switches is to control the value of the effective inductance in the unit cell.

The value of an inductor is a function of the area encompassing its magnetic field. When the switch is open as shown in the top portion of FIG. 4 (L bit low), the intermediate lines have no current flow and as a result do not shield the magnetic field produced by the current flowing in the signal line. Hence, the effective inductance is determined by the area between the signal line and the outer ground lines. On the other hand, when the switch is on (L bit high) as shown in the lower portion of FIG. 4, the intermediate lines shield the magnetic field. As a result, the inductance is determined by the smaller area between the signal line and the middle lines. In other words, the ground shields act as inductors that are coupled to the inductance of the signal line. By switching between the two different lines, the mutual inductance between the ground and signal line is effectively controlled, altering the overall inductance seen across the unit cell.

For ideal phase characteristics, switching should only change the delay without altering the characteristic impedance Zo. To achieve this, the shunt capacitance in the unit cell switches concurrent to any change in the unit inductance. In the depicted embodiment, the capacitance is controlled by an NMOS switch driven by the control bit 'C'. When the inductance is decreased by switching in the inner lines, the capacitor is switched out to decrease the capacitance. In this way, proper design of the capacitance size ensures that the ratio between the inductance and capacitance are maintained in the two delay modes, minimizing any change in Zo.

The distance between the ground and signal lines as well as the capacitance and switch sizes are determined based on EM simulation of the unit cell. The structure is optimized to maintain the uniform impedance, while maximizing the difference between the delay ($\sqrt{LC}$) in the two modes of operation. This is achieved by maximizing the relative change in the inductance ($\Delta L/L$) and the capacitance ($\Delta C/C$), ensuring the largest change in their product, i.e. the relative change in the delay per unit cell.

Beside minimal dispersion in phase, constant amplitude is necessary for consistency in the overall gain of the front-end. However, during the process of switching between different delay modes, loss characteristics of the line inevitably changes. This is because the loss introduced by the switches operating in the two modes are different. In this particular design, simulations indicate that the C-switch in the high-delay mode introduces a slightly higher loss compared to the L-switch in the low-delay mode. Such loss imbalance when accumulated across the entire transmission line can result in few dBs of loss variation between the two extreme delay settings. To counter this imbalance we introduce a balancing S-switch parallel to the signal line as shown in FIG. 4. This extra switch is turned on in the low-delay mode acting as a shunt resistor in the signal line, thus increasing the loss. By appropriately sizing this switch we achieve balanced loss in the two modes which results in minimum amplitude variation between different delay settings.

If the simulated phase change from a unit cell is, for example, around 5 degrees, a phase shifter could employ approximately 40 cascaded unit cells to achieve at least 180 degrees of phase shift. In principle, the phase control resolution is limited by the size of the unit cell and can be further reduced using a finer unit cell. In the embodiment depicted in FIG. 4, each unit cell has 3 bits named an L-bit, C-bit, and S-bit which control the value of the inductor, capacitor, and loss, respectively. All of the bits in the cells (e.g., 40 cells with 3 bits each) could be controlled by a digital decoder through a serial interface.

Figure 5:
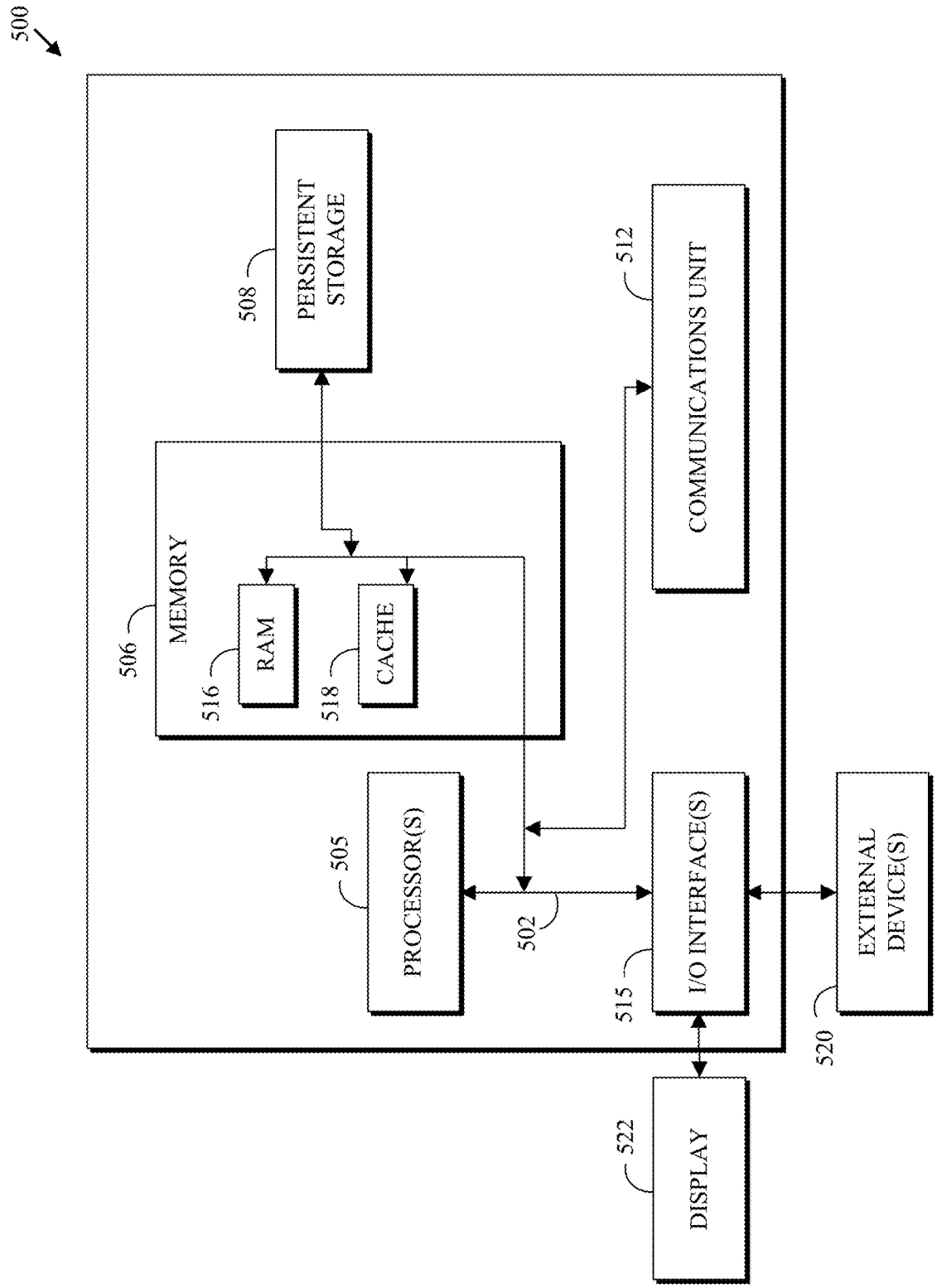
FIG. 5 is a block diagram depicting one example of a computing apparatus suitable for executing one or more of the methods disclosed herein.

FIG. 5 is a block diagram depicting one example of a computing apparatus (i.e., computer 500) suitable for executing one or more of the methods disclosed herein. For example, the computer 500 may control the switching module 100 and/or the polarization control module 200 in conjunction with sending and receiving wireless signals or the like. It should be appreciated that FIG. 5 provides only an illustration of one embodiment and does not imply any limitations with regard to the environments in which different embodiments may be implemented. Many modifications to the depicted environment may be made.

As depicted, the computer 500 includes communications fabric 502, which provides communications between computer processor(s) 505, memory 506, persistent storage 508, communications unit 512, and input/output (I/O) interface(s) 515. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In the depicted embodiment, memory 506 includes random access memory (RAM) 516 and cache memory 518. In general, memory 506 can include any suitable volatile or non-volatile computer readable storage media.

One or more programs may be stored in persistent storage 508 for execution by one or more of the respective computer processors 505 via one or more memories of memory 506. The persistent storage 508 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 512, in these examples, provides for communications with other data processing systems or devices. In these examples, communications unit 512 includes one or more network interface cards. Communications unit 512 may provide communications through the use of either or both physical and wireless communications links.

I/O interface(s) 515 allows for input and output of data with other devices that may be connected to computer 500. For example, I/O interface 515 may provide a connection to external devices 520 such as a keyboard, keypad, a touch screen, and/or some other suitable input device. External devices 520 can also include portable computer readable storage media such as, for example, thumb drives, portable optical or magnetic disks, and memory cards.

Software and data used to practice embodiments of the present invention can be stored on such portable computer readable storage media and can be loaded onto persistent storage 508 via I/O interface(s) 515. I/O interface(s) 515 may also connect to a display 522. Display 522 provides a mechanism to display data to a user and may be, for example, a computer monitor.

One of skill in the art will appreciate that the above disclosed embodiments may be adapted for a variety of environments and applications. Furthermore, the programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The embodiments disclosed herein include a system, a method, and/or a computer program product. The computer program product may include a computer readable storage medium (or media) having computer readable program instructions thereon for causing a processor to carry out the methods disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An apparatus comprising:
   first and second electronically tunable transmission lines configured to transmit or receive a signal pair and provide a selected phase delay difference to the signal pair;
   a first shunting element connected to the first electronically tunable transmission line and a second shunting element connected to the second electronically tunable transmission line; and
   wherein the first and second shunting elements are each configured to selectively shunt the electronically tunable transmission line to which they are connected according to one or more shunting control signals.

2. The apparatus of claim 1, wherein the first electronically tunable transmission line or the second electronically tunable transmission line is configured to provide a selected phase delay to a signal of the signal pair.

3. The apparatus of claim 1, wherein the first shunting element or the second shunting element is a transistor.

4. The apparatus of claim 3, wherein activating the transistor shunts to ground the electronically tunable transmission line to which it is connected.

5. The apparatus of claim 1, wherein the first shunting element or the second shunting element is an electronically controlled switch.

6. The apparatus of claim 1, further comprising a third shunting element connected to the first electronically tunable transmission line and a fourth shunting element connected to the second electronically tunable transmission line.

7. The apparatus of claim 6, wherein the third and fourth shunting elements are each configured to selectively shunt the electronically tunable transmission line to which they are connected according to the one or more shunting control signals.

8. The apparatus of claim 6, wherein the third shunting element or the fourth shunting element comprises a transistor.

9. The apparatus of claim 6, wherein the third shunting element or the fourth shunting element comprises an electronically controlled switch.

10. The apparatus of claim 1, wherein the signal pair comprises signals connected to antennas producing orthogonal polarizations.

11. The apparatus of claim 1, wherein the first and second electronically tunable transmission lines are bi-directional electronically tunable transmission lines.

12. A method comprising:
providing a signal pair to first and second electronically tunable transmission lines configured to transmit or receive the signal pair and provide a selected phase delay difference to the signal pair;
providing a first shunting element connected to the first electronically tunable transmission line and a second shunting element connected to the second electronically tunable transmission line;
providing one or more shunting control signals; and
wherein the first and second shunting elements are each configured to selectively shunt the electronically tunable transmission line to which they are connected according to the one or more shunting control signals.

13. The method of claim 12, wherein the first electronically tunable transmission line or the second electronically tunable transmission line is configured to provide a selected phase delay to a signal of the signal pair.

14. The method of claim 12, wherein the first shunting element or the second shunting element is a transistor.

15. The method of claim 12, wherein activating the transistor shunts to ground the electronically tunable transmission line to which it is connected.

16. The method of claim 12, wherein the first shunting element or the second shunting element is an electronically controlled switch.

17. An apparatus comprising:
first and second antenna ports;
first and second electronically tunable transmission lines configured to receive/transmit a signal pair from/to the first and second antenna ports, respectively, and provide a selected phase delay difference to the signal pair;
a first shunting element connected to the first electronically tunable transmission line and a second shunting element connected to the second electronically tunable transmission line; and
wherein the first and second shunting elements are each configured to selectively shunt the electronically tunable transmission line to which they are connected according to one or more shunting control signals.

18. The apparatus of claim 17, wherein the first electronically tunable transmission line or the second electronically tunable transmission line is configured to provide a selected phase delay to a signal of the signal pair.

19. The apparatus of claim 17, wherein the first shunting element or the second shunting element is a transistor.

20. The apparatus of claim 17, wherein the first shunting element or the second shunting element is an electronically controlled switch.

\* \* \* \* \*